US010672304B2

(12) United States Patent
Choi et al.

(10) Patent No.: US 10,672,304 B2
(45) Date of Patent: Jun. 2, 2020

(54) DISPLAY DEVICE

(71) Applicant: Samsung Display Co., Ltd., Yongin-si, Gyeonggi-do (KR)

(72) Inventors: Tae Hyeok Choi, Seoul (KR); Hee Na Kim, Hwaseong-si (KR); Sang Jin Park, Yongin-si (KR); Young Seok Baek, Hwaseong-si (KR); Mi Jung Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/440,817

(22) Filed: Jun. 13, 2019

(65) Prior Publication Data

US 2020/0105168 A1 Apr. 2, 2020

(30) Foreign Application Priority Data

Sep. 27, 2018 (KR) .................. 10-2018-0114881

(51) Int. Cl.
*G09F 9/30* (2006.01)
*H01L 51/00* (2006.01)
*H01L 51/52* (2006.01)
*H01L 27/32* (2006.01)
*G06F 1/16* (2006.01)

(52) U.S. Cl.
CPC ............ *G09F 9/301* (2013.01); *G06F 1/1652* (2013.01); *H01L 51/0097* (2013.01); *H01L 51/5253* (2013.01); *H01L 27/3276* (2013.01)

(58) Field of Classification Search
CPC .................. G09F 9/301; G06F 1/1652; H01L 51/0096–0097; H01L 2251/5388; H01L 51/5253–5256

See application file for complete search history.

(56) References Cited

U.S. PATENT DOCUMENTS

| 9,349,969 | B2 | 5/2016 | Kwon et al. | |
| 10,020,462 | B1* | 7/2018 | Ai | H01L 51/524 |
| 2016/0204366 | A1 | 7/2016 | Zhang et al. | |
| 2016/0295685 | A1* | 10/2016 | Ryu | G06F 1/1652 |
| 2017/0110626 | A1* | 4/2017 | Jorgenson | H01L 33/105 |
| 2018/0090698 | A1* | 3/2018 | Jeong | H01L 27/3276 |
| 2018/0097197 | A1* | 4/2018 | Han | G06F 1/1626 |
| 2018/0166019 | A1* | 6/2018 | Lee | H01L 27/3276 |
| 2019/0067410 | A1* | 2/2019 | Kwon | H01L 27/3276 |
| 2019/0248102 | A1* | 8/2019 | Song | G02F 1/133305 |

FOREIGN PATENT DOCUMENTS

| KR | 10-2017-0071047 A | | 6/2017 |
| KR | 2017072999 A | * | 6/2017 |
| KR | 10-2018-0036853 A | | 4/2018 |

* cited by examiner

*Primary Examiner* — Mariceli Santiago
(74) *Attorney, Agent, or Firm* — Lewis Roca Rothgerber Christie LLP

(57) ABSTRACT

A display device according to some example embodiments includes: a substrate including a first area, a second area, and a bending area between the first area and the second area; a display unit overlapping the first area; and a protection layer overlapping the bending area, wherein the substrate includes a groove at the bending area, and the protection layer is formed in the groove.

16 Claims, 10 Drawing Sheets

DISPLAY DEVICE

CROSS-REFERENCE TO RELATED APPLICATION

This application claims priority to and the benefit of Korean Patent Application No. 10-2018-0114881 filed in the Korean Intellectual Property Office on Sep. 27, 2018, the entire contents of which are incorporated herein by reference.

BACKGROUND

1. Field

The present disclosure relates to a display device.

2. Description of the Related Art

Display devices such as organic light emitting diode displays and a liquid crystal displays are manufactured by forming a plurality of layers and elements on a substrate.

Recently, display devices using flexible substrates that are light, strong against impacts, and easily deformed may be utilized. Display devices using flexible substrates may be manufactured to bend at an edge where a pad portion is located, thereby reducing a dead space compared to a display device using a rigid substrate.

The above information disclosed in this Background section is only for enhancement of understanding of the background of the invention and therefore it may contain information that does not constitute prior art that is already known in this country to a person of ordinary skill in the art.

SUMMARY

Aspects of some example embodiments may include a display device that is robust against bending of a substrate and easily relieves stress applied to the substrate.

A display device according to some example embodiments includes: a substrate including a first area, a second area, and a bending area between the first area and the second area; a display unit overlapping the first area; and a protection layer overlapping the bending area, wherein the substrate includes a groove formed at the bending area, and the protection layer is in the groove.

The substrate may include a first polymer layer, a first barrier layer, and a second polymer layer.

The second polymer layer may include the groove.

The display device may further include an insulating layer at the bending area, and the insulating layer may include at least one among a first insulating layer, a second insulating layer, and a third insulating layer extending from a display unit.

The insulating layer may include a through-hole, and an edge of the through-hole and an edge of the groove may be aligned.

The protection layer may overlap part of the first area and the second area.

The display device may further include a driving unit at the second area, and a signal line connecting the driving unit and the display unit and crossing the bending area.

The groove may have a dot shape in a plan view.

The groove may have a line shape in a plan view.

The groove may be separated from the signal line in a plan view.

A display device according to some example embodiments includes: a substrate including a first area, a second area, and a bending area between the first area and the second area; a display unit overlapping the first area; a protection layer overlapping the bending area; and an insulating layer between the protection layer and the substrate, wherein the protection layer includes a protrusion penetrating at least part of the insulating layer and the substrate.

The substrate may include a first polymer layer, a first barrier layer, and a second polymer layer.

The second polymer layer may include a groove, and the protrusion may be in the groove.

The insulating layer may include a through-hole overlapping the groove, and the protrusion may be in the through-hole.

The insulating layer may include at least one among a first insulating layer, a second insulating layer, and a third insulating layer extending from the display unit.

The protection layer may overlap a part of the first area and the second area.

The display device may further include a driving unit at the second area, and a signal line connecting the driving unit and the display unit and crossing the bending area.

The protrusion may have a dot shape in a plan view.

The protrusion may have a line shape in a plan view.

The protrusion may be separated from the signal line in a plan view.

According to some example embodiments, bending of the substrate may be relatively easy. Also, adherence between the bent substrate and the protection layer may be excellent. Further, stress applied to the substrate may be relieved such that cracking in the bending area may be reduced.

DETAILED DESCRIPTION

Figure 1:
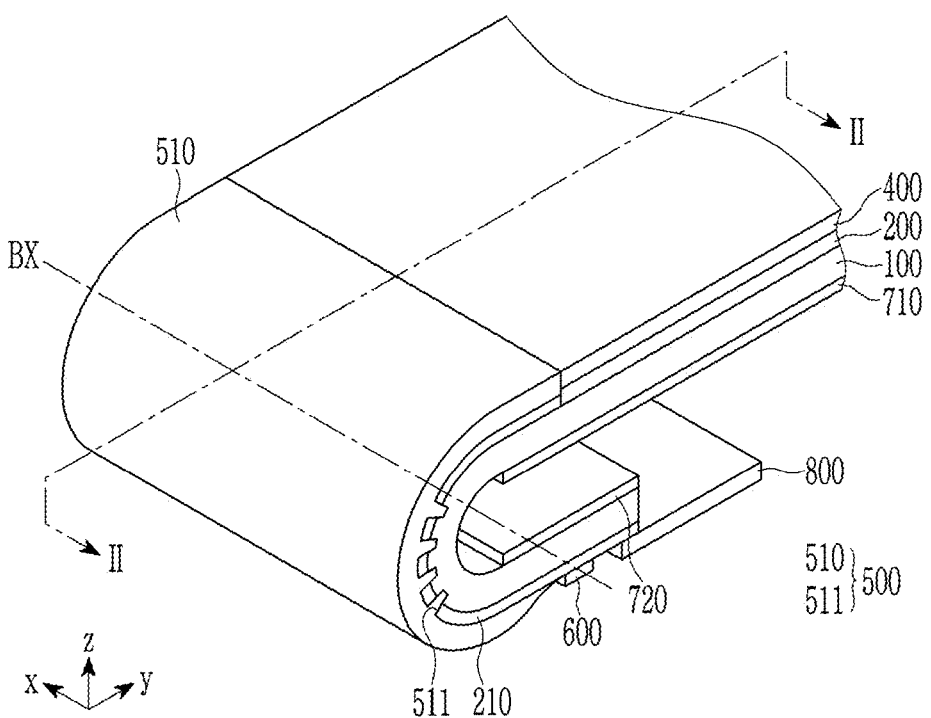
FIG. 1 is a schematic perspective view of a display device according to some example embodiments of the present invention.

Hereinafter, aspects of some example embodiments of the present invention will be described more fully with reference to the accompanying drawings, in which example embodiments of the present invention are shown. As those skilled in the art would realize, the described example embodiments may be modified in various different ways, all without departing from the spirit or scope of the present invention.

The drawings and description are to be regarded as illustrative in nature and not restrictive, and like reference numerals designate like elements throughout the specification.

In the drawings, size and thickness of each element are arbitrarily illustrated for convenience of description, and the present invention is not necessarily limited to as illustrated in the drawings. In the drawings, the thickness of layers, films, panels, areas, etc., are exaggerated for clarity. In the drawings, the thicknesses of layers and areas are exaggerated for convenience of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Now, a display device according to some example embodiments of the present invention is described with reference to FIG. 1 to FIG. 3. FIG. 1 is a schematic perspective view of a display device according to some example embodiments, FIG. 2 is a cross-sectional view taken along a line II-II of FIG. 1, and FIG. 3 is a cross-sectional view of a partial area in a state that a display device is unfolded according to some example embodiments.

Figure 2:
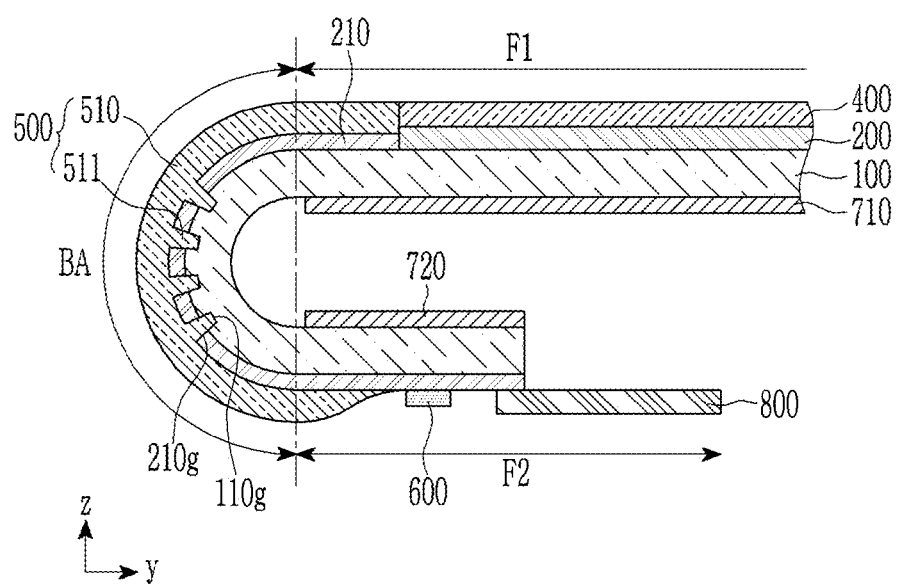
FIG. 2 is a cross-sectional view taken along a line II-II of FIG. 1.

The display device according to some example embodiments has a shape in which a part of a substrate 100 is bent, as shown in FIG. 1 and FIG. 2. The substrate 100 may include various materials having a flexible or bendable characteristic.

Figure 3:
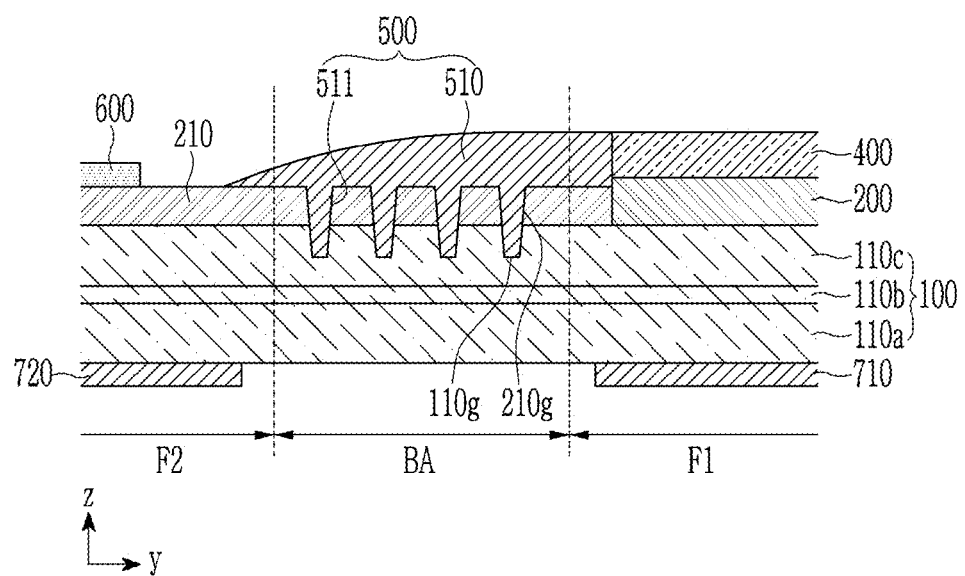
FIG. 3 is a cross-sectional view of a partial area in a state that a display device is unfolded according to some example embodiments of the present invention.

As an example, as shown in FIG. 3, the substrate 100 may include polymer layers 110a and 110c and a barrier layer 110b. The substrate 100 may have a structure in which the first polymer layer 110a, the first barrier layer 110b, and the second polymer layer 110c are sequentially stacked, however embodiments are not limited thereto. The substrate 100 may have any shape where a barrier layer is placed between a plurality of polymer layers.

The polymer layer 110a and 110c may include one selected from a group consisting of polyether sulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The barrier layer 110b may include at least one among a silicon oxide, a silicon nitride, and an aluminum oxide. The barrier layer 110b is not limited to the above-described materials, and may include any inorganic material.

The substrate 100 includes a first area F1 and a second area F2 of a flat state, and a bending area BA located between the first area F1 and the second area F2. The substrate 100 may include the bending area BA that is bent based on a bending axis BX parallel to an x direction. In the state that the substrate 100 is bent, the first area F1 and the second area F2 may be overlapped along a z direction.

As illustrated, for example, in FIG. 2, the substrate 100 may include a groove 110g. For example, the substrate 100 may include a plurality of grooves 110g located in the bending area BA. The groove 110g may have a recessed shape from one surface of the substrate 100. The substrate 100 of the area where the groove 110g is formed may have a thinner thickness than that of the substrate 100 of other areas.

According to some example embodiments, the second polymer layer 110c may include a plurality of grooves 110g. As shown in FIG. 3, the second polymer layer 110c may include a groove 110g with a recessed shape from one surface of the second polymer layer 110c.

The height of the groove 110g may be smaller than the height of the second polymer layer 110c. When the height of the groove 110g is higher than the height of the second polymer layer 110c, the groove 110g may penetrate the second polymer layer 110c to extend to the first barrier layer 110b. The first barrier layer 110b prevents or reduces instances of impurities or moisture penetrating a display unit 200 and other constituent elements. When the groove 110g extends to the first barrier layer 110b, an impurity preventing or reducing effect by the first barrier layer 110b may be deteriorated. Accordingly, the groove 110g according to some example embodiments may be located within the second polymer layer 110c and may not penetrate the first barrier layer 110b while penetrating the second polymer layer 110c.

An insulating layer 210 extending from the display unit 200 may be located in the bending area BA according to some example embodiments. The insulating layer 210 may be a single layer or a multilayer. The insulating layer 210 may include an organic insulating material or an inorganic insulating material.

The insulating layer 210 may include at least one through-hole 210g. The through-hole 210g may completely penetrate the insulating layer 210. The height of the through-hole 210g may be the same as the height of the insulating layer 210.

According to some example embodiments, the through-hole 210g included in the insulating layer 210 and the groove 110g included in the substrate 100 may overlap each other. The edge of the through-hole 210g and the groove 110g may be aligned. The interior circumference of the through-hole 210g and the interior circumference of the groove 110g may substantially form the same surface. In the manufacturing process, the through-hole 210g and the groove 110g may be formed through one process.

According to some example embodiments, the through-hole 210g and the groove 110g may be formed through any suitable laser process or an etching process. The laser process may use, for example, a nano-laser, a pico-laser, a femto-laser, or laser drilling.

The plane size of the through-hole 210g located at the relatively upper portion may be larger than the plane size of the groove 110g. The diameter of the through-hole 210g and the groove 110g may be smaller toward the substrate 100, but is not limited thereto. The plane described in this specification refers to the xy plane.

A protection layer 500 may be located on the insulating layer 210 in the bending area BA. The insulating layer 210 may be between the protection layer 500 and the substrate 100. The protection layer 500 may also overlap part of the first area F1 and the second area F2 according to an exemplary embodiment.

The protection layer 500 may protect the signal line, the insulating layer 210, the substrate 100, etc., located in the bending area BA. When including the protection layer 500, a neutral plane in the bending area BA may relatively rise. For example, when the substrate 100 is bent, the neutral plane of the bending area BA may be located near the surface where the signal line is located and the signal lines may receive little compressive force or tensile force. The protection layer 500 may prevent or reduce instances of cracking of the signal line or the insulating layer in the bending area BA. For example, in the bending area BA, it may be possible to prevent or reduce instances of the signal line being disconnected and causing defects.

The protection layer 500 may include a first area 510 covering the bending area BA and protrusion 511 protruded from the first area 510. The protrusions 511 may penetrate the insulating layer 210 and extend to overlap the part of the substrate 100.

Each protrusion 511 may be located within a through-hole 210g included in the insulating layer 210. Also, the protrusion 511 may be located within the groove 110g included in the substrate 100. For example, the protrusion 511 may be located within the groove 110g included in the second polymer layer 110c. The protrusion 511 may have the shape filling the through-hole 210g and the groove 110g.

The protrusion 511 may have a shape with a size that becomes smaller closer to the substrate 100. The protrusion 511 may have a shape that fills the through-hole 210g and the groove 110g, and the plane area of the through-hole 210g and the groove 110g may be smaller closer to the substrate 100. Accordingly, the protrusion 511 located within the through-hole 210g and the groove 110g may also have a shape of which the plane area is smaller closer to the substrate 100.

The protection layer 500 may be formed of the organic material such as a polyimide, an epoxy resin, an acryl-based resin, a polyester, a photoresist, a polyacryl-based resin, a polyimide-based resin, a polyamide-based resin, a siloxane-based resin, an elastic material such as silicone, urethane, a thermoplastic polyurethane, and the like.

According to some example embodiments, the bending area BA may include the through-hole 210g and the groove 110g. The through-hole 210g and the groove 110g may absorb the stress applied to the substrate 100 and the insulating layer 210 by the bending of the substrate 100.

Also, the protection layer 500 according to some example embodiments includes the protrusion 511 within the through-hole 210g and the groove 110g. The protection layer 500 may enhance the adherence with the substrate 100 and the insulating layer 210 by the protrusion 511. Accordingly, it may be possible to prevent the cracking or detaching of the constituent elements caused by the bending.

The first area F1 of the substrate 100 overlaps the display unit 200 and a polarization layer 400. As shown in FIG. 2, the first area F1 may include a partial area outside the display unit 200, but it is not limited thereto.

The display unit 200 may include the plurality of thin film transistors and a light-emitting element connected thereto. This is described later with reference to FIG. 8. The present specification describes an example embodiment in which the display unit 200 includes the light-emitting element, however embodiments are not limited thereto, and a liquid crystal element may be included.

The display device according to some example embodiments may further include a touch unit and an adhesive layer located between the display unit 200 and the polarization layer 400.

The touch unit may sense external touch information and use it as an input signal to obtain coordinate information of an input position. The touch unit may be provided as an additional unit to be mounted on the display unit 200 or may be formed directly on the display unit 200 to be embedded.

The adhesive layer may be located between the polarization layer 400 and the display unit 200. The adhesive layer may be a transparent adhesive layer. As an example, the adhesive layer may include an optically clear adhesive (OCA), an optically clear resin (OCR), or a pressure sensitive adhesive (PSA).

The polarization layer 400 may be located on the display unit 200. The polarization layer 400 may reduce external light reflection. When the external light again passes through the polarization layer 400 after passing through the polarization layer 400 and then is reflected from the display unit 200, a phase of the external light may be changed. The phase of the reflected light and the phase of the external light entering the polarization layer 400 are different, and extinction interference may occur between the reflected light and the external light.

The second area F2 and the bending area BA may include a non-display area corresponding to an outer area of the display unit 200.

A driving unit 600 may be located at the second area F2 of the substrate 100. The driving unit 600 is connected to a pad unit located on the substrate 100 through the signal line crossing the bending area BA, thereby supplying a data signal and a gate signal (hereinafter referred to as 'a signal') to the gate line and the data line.

Also, a flexible circuit board 800 may be connected to the pad unit of the substrate 100, and the driver IC may be mounted on the flexible circuit board 800. A chip on film (COF), a chip on plastic (COP), or a flexible printed circuit (FPC) may be applied to the flexible circuit board 800, and the driver IC for supplying the signal to the display unit 200 may be mounted on the flexible circuit board 800.

Protection layers 710 and 720 may be located on the rear surface of the substrate 100. The display device according to some example embodiments may include the first protection layer 710 overlapping the first area F1 and the second protection layer 720 overlapping the second area F2.

The separation space between the first protection layer 710 and the second protection layer 720 may overlap the bending area BA. The first protection layer 710 may overlap the first area F1, and may also overlap the entire surface of the display unit 200 and the polarization layer 400. The first protection layer 710 may be in contact with the substrate 100. The second protection layer 720 may overlap the second area F2 and part of the driving unit 600 and the flexible circuit board 800 according to some example embodiments.

Figure 4:
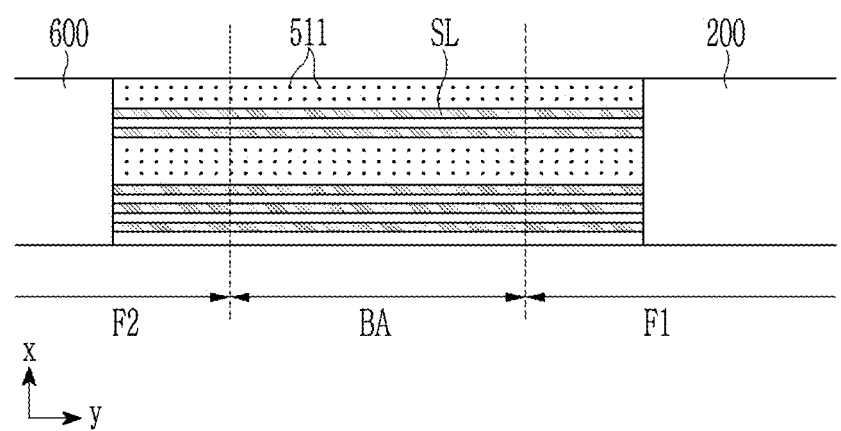
FIG. 4 is a top plan view of a partial area of a display device in a state that a substrate is unfolded according to some example embodiments of the present invention.
Figure 5:
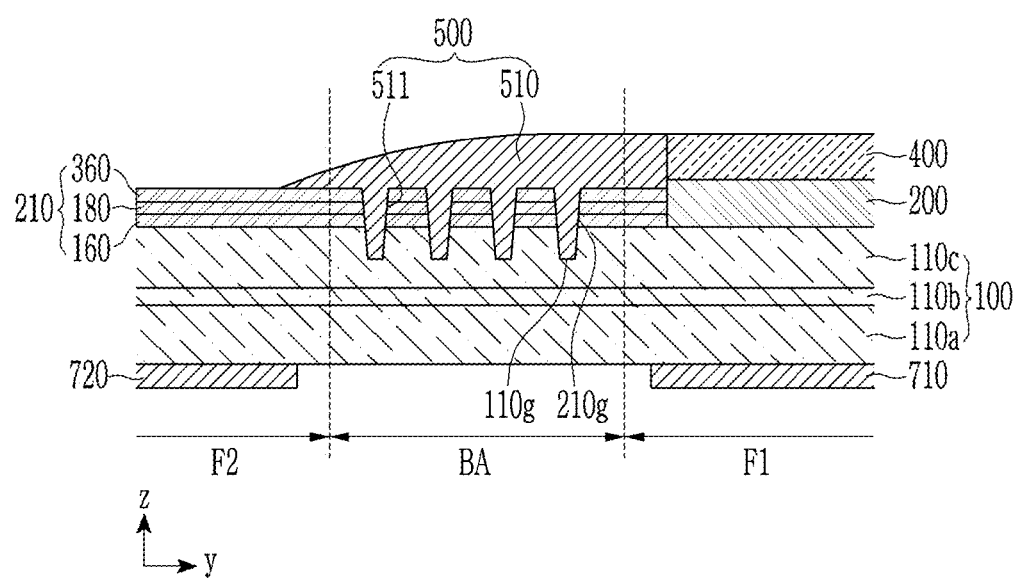
FIG. 5 is a cross-sectional view of an area where a protrusion is located in the example embodiment of FIG. 4.
Figure 6:
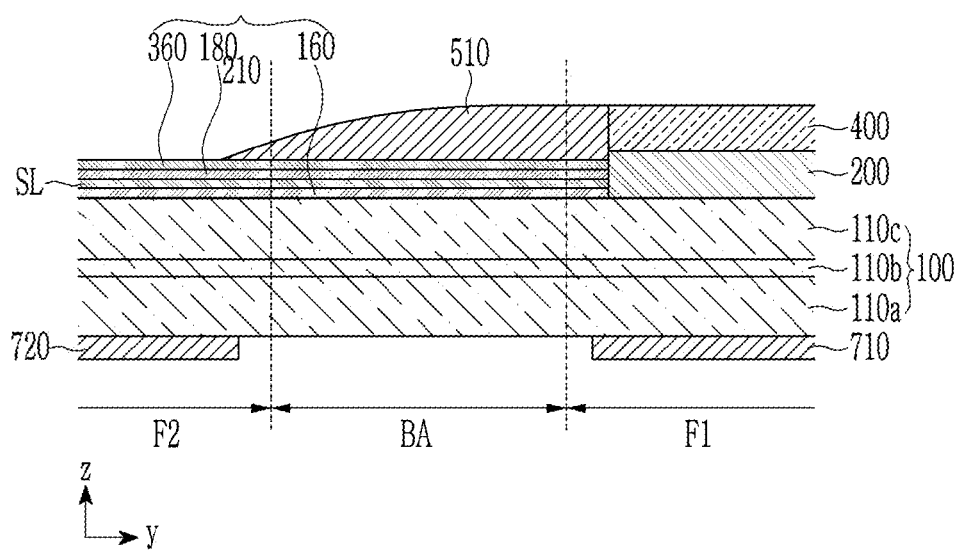
FIG. 6 is a cross-sectional view of an area where a signal line is located in the example embodiment of FIG. 4.

Next, the display device according to some example embodiments is described with reference to FIG. 4 to FIG. 6. FIG. 4 is a top plan view of a partial area of a display device in a state that a substrate is unfolded, FIG. 5 is a cross-sectional view of an area where a protrusion is located in the example embodiment of FIG. 4, and FIG. 6 is a cross-sectional view of an area where a signal line is located in the example embodiment of FIG. 4. Some repetitive description for the constituent elements described with reference to FIG. 1 to FIG. 3 is omitted for brevity.

First, referring to FIG. 4, the display device according to some example embodiments may further include a signal line SL connecting the display unit 200 and the driving unit 600.

The signal line SL may overlap the bending area BA. The signal line SL may have a shape extending along the y direction. According to some example embodiments, the signal line SL may be connected to a metal line located at the display unit 200, and may be located on the same layer as the gate line or on the same layer as the data line. The signal line SL according to some example embodiments may be located on the same layer as the data conductor.

Referring to FIG. 5, according to some example embodiments, the insulating layer 210 may include at least one among a first insulating layer 160, a second insulating layer 180, and a third insulating layer 360. In the present specification, the example embodiment in which the insulating layer 210 includes the first insulating layer 160, the second insulating layer 180, and the third insulating layer 360 is described, however it is not limited thereto. The first insulating layer 160, the second insulating layer 180, and the third insulating layer 360 may be constituent elements extending from the display unit 200.

The display unit 200 according to some example embodiments may include the first insulating layer 160, the second insulating layer 180, and the third insulating layer 360. The first insulating layer 160, the second insulating layer 180, and the third insulating layer 360 may extend from the first area F1 in which the display unit 200 is located to the bending area BA and the second area F2.

The first insulating layer 160 may be located between a gate electrode and a source electrode and between the gate electrode and a drain electrode, which are described in more detail later. The second insulating layer 180 may be located between the source electrode and a pixel electrode and between the drain electrode and the pixel electrode, which are described in more detail later. The third insulating layer 360 may be located between the pixel electrode and the common electrode, which are described in more detail later.

The protrusion 511 of the protection layer 500 may be in contact with the substrate 100 through the through-hole 210g included in the first insulating layer 160, the second insulating layer 180, and the third insulating layer 360. The second polymer layer 110c of the substrate 100 may include a groove 110g, and the protrusion 511 may extend to the groove 110g. The protrusion 511 may be filled in the groove 110g included in the through-hole 210g and the second polymer layer 110c.

The protrusion 511 according to some example embodiments may be separated from the signal line SL in a plan view. Also, the through-hole 210g and the groove 110g at which the protrusion 511 is located may be separated from the signal line SL in a plan view.

Further, according to some example embodiments, the through-hole 210g, the groove 110g, and the protrusion 511 may have a dot shape in a plan view. However, the through-hole 210g, the groove 110g, and the protrusion 511 may also be located in any area that does not overlap the signal line SL, and are not limited to the shape shown in FIG. 4. Also, the present specification shows the through-hole 210g, the groove 110g, and the protrusion 511 of the dot shape, however embodiments are not limited thereto, and the through-hole 210g, the groove 110g, and the protrusion 511 of any shape in a plan view may be possible.

Referring to FIG. 6, the through-hole 210g, the groove 110g, and the protrusion 511 are not located in the bending area BA in which the signal line SL is located. The first area 510 included in the protection layer 500 may be located with a shape overlapping the signal line SL.

Figure 7:
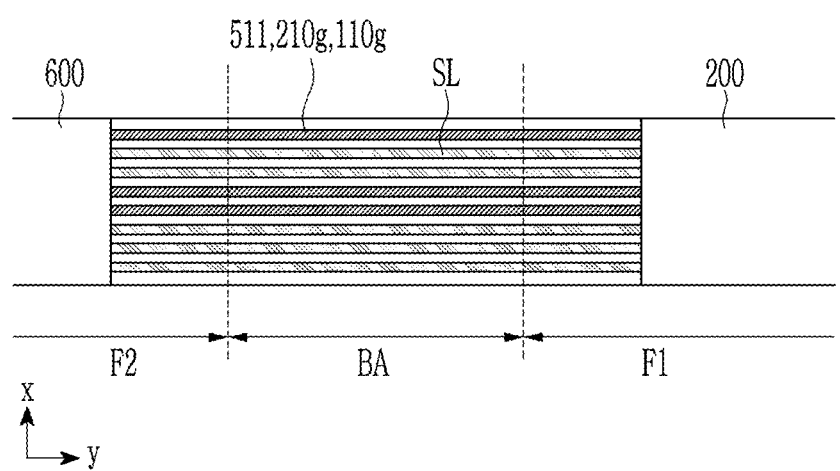
FIG. 7 is a top plan view of a partial area of a display device according to some example embodiments of the present invention.

Next, the display device according to some example embodiments is described with reference to FIG. 7. FIG. 7 is a top plan view of a partial area of a display device according to some example embodiments. The description for the same constituent elements as the above-described constituent elements is omitted.

Referring to FIG. 7, the protrusion 511 may have a line shape in a plan view. As one example, the protrusion 511 may have the line shape extending along the y direction.

According to some example embodiments, the signal line SL connecting the display unit 200 and the driving unit 600 may extend along the y axis. The signal line SL and the protrusion 511 may be parallel in a plan view.

The through-hole 210g and the groove 110g at which the protrusion 511 is located may also have the line shape in a plan view. As an example, the through-hole 210g and the groove 110g may have the line shape extending along the y direction. The signal line SL and the through-hole 210g, and the signal line SL and the groove 110g, may also have the substantially parallel shape in a plan view.

The groove 110g, the through-hole 210g, and the protrusion 511 may also be located in any area that does not overlap the signal line SL, and may also have any shape. The present specification shows the groove 110g, the through-hole 210g, and the protrusion 511 of the line shape extending along the y axis, however embodiments are not limited thereto.

Figure 8:
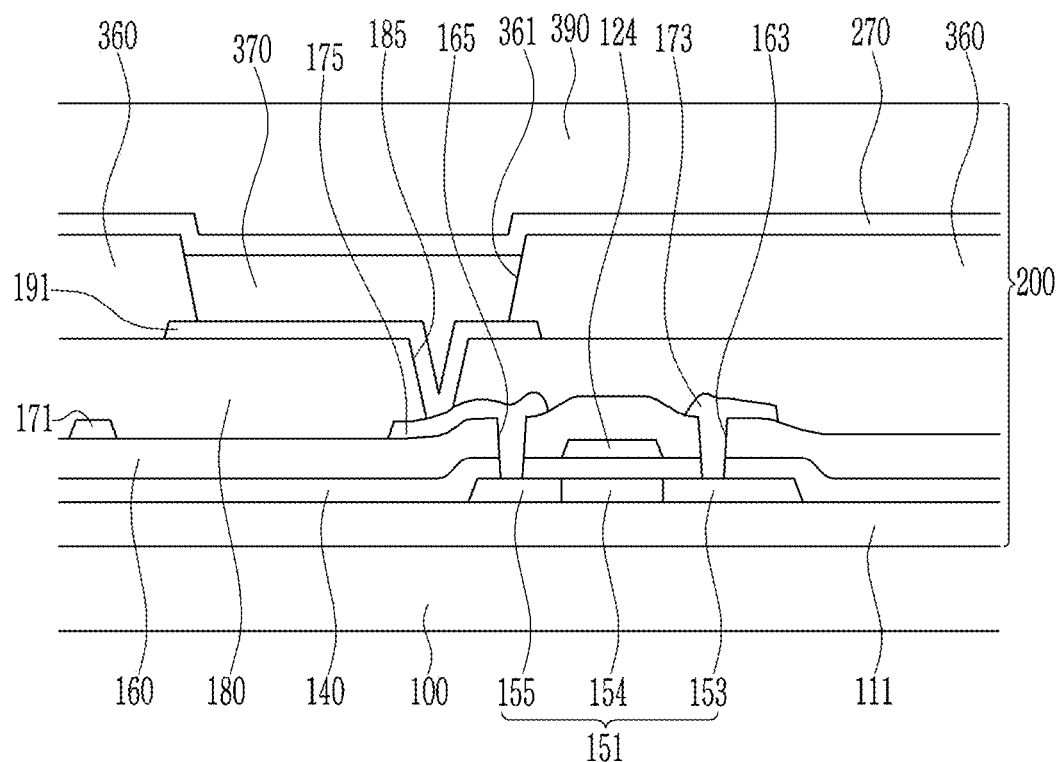
FIG. 8 is a cross-sectional view of a thin film transistor and a light-emitting element included in a display unit according to some example embodiments of the present invention.

Next, the thin film transistor and the light-emitting element included in the display unit 200 are described with reference to FIG. 8. FIG. 8 is a cross-sectional view of a thin film transistor and a light-emitting element included in a display unit according to some example embodiments.

The display unit 200 according to some example embodiments includes a buffer layer 111 located on the substrate 100. The buffer layer 111 may overlap the entire surface of the substrate 100. The buffer layer 111 may include an inorganic material such as a silicon oxide (SiOx), a silicon nitride (SiNx), etc. The buffer layer 111 may be a single layer or a multi-layer.

The buffer layer 111 may flatten one surface of the substrate 110 to planarize it, and may prevent or reduce instances of an impurity degrading the characteristics of a later-described semiconductor layer 151 being diffused and the penetration of moisture, etc. According to some example embodiments, the buffer layer 111 may be omitted.

The semiconductor layer 151 of the thin film transistor is located on the buffer layer 111. The semiconductor layer 151 includes a channel area 154, and a source area 153 and a drain area 155 located at respective sides of the channel area 154 and doped with an impurity.

The semiconductor layer 151 may include a polysilicon, an amorphous silicon, or an oxide semiconductor.

A gate insulating layer 140 is located on the semiconductor layer 151. The gate insulating layer 140 may be located to overlap the entire surface of the substrate 100. The gate insulating layer 140 may include the inorganic insulating material such as a silicon oxide (SiOx), a silicon nitride (SiNx), etc.

A gate conductor including a gate electrode 124 of the thin film transistor is located on the gate insulating layer 140. The gate electrode 124 may overlap the channel area 154 of the semiconductor layer 151.

The first insulating layer 160 including the inorganic insulating material or the organic insulating material is located on the gate electrode 124. The first insulating layer 160 may extend to the bending area and the second area as above-described.

A data conductor including a source electrode 173 and a drain electrode 175 of the thin film transistor, a data line 171, a driving voltage line, and the like is located on the first insulating layer 160. The source electrode 173 and the drain electrode 175 may be respectively connected to the source area 153 and the drain area 155 of the semiconductor layer 151 through contact holes 163 and 165 included in the first insulating layer 160 and the gate insulating layer 140.

The gate electrode 124, the source electrode 173, and the drain electrode 175 form the thin film transistor along with the semiconductor layer 151. The shown thin film transistor may be a driving transistor included in one pixel of the emissive display device. Because the gate electrode 124 is located on the semiconductor layer 151 in the shown thin film transistor, it is referred to as a top-gate transistor. The structure of the transistor is not limited thereto and may be variously changed, and for example, it may be a bottom-gate transistor in which the gate electrode is positioned under the semiconductor.

The second insulating layer 180 is located on the first insulating layer 160 and the data conductor. The second insulating layer 180 serves to remove and planarize a step in order to increase emission efficiency of the organic light emitting element to be formed thereon. The second insulating layer 180 may overlap and cover the thin film transistor. The second insulating layer 180 may extend to the bending area and the second area as above-described.

A pixel electrode 191 is located on the second insulating layer 180. The pixel electrode 191 may be connected to the drain electrode 175 of the thin film transistor though a contact hole 185 of the second insulating layer 180.

The third insulating layer 360 is located on the second insulating layer 180 and the pixel electrode 191. The third insulating layer 360 may overlap part of the pixel electrode 191. The third insulating layer 360 has an opening 361 overlapping part of the pixel electrode 191. The third insulating layer 360 may extend to the bending area and the second area as above-described.

The third insulating layer 360 may include the organic insulating material such as a polyimide, a polyacrylate, and a polyamide, however embodiments are not limited thereto.

An emission layer 370 is located on the pixel electrode 191. The emission layer 370 includes a light emission area. The emission layer 370 may additionally include at least one among a hole injection area, a hole transport area, an electron injection area, and an electron transport area.

The emission layer 370 may include an organic material uniquely emitting light of primary colors such as red, green, blue, etc. Also, the emission layer 370 may have a structure in which a plurality of organic materials emitting different colors of light is stacked. The emission layer 370 may include the inorganic material emitting light of red, green, blue etc.

A common electrode 270 transmitting a common voltage is located on the emission layer 370 and the third insulating layer 360.

The pixel electrode 191, the emission layer 370, and the common electrode 270 of each pixel form the light-emitting element as a light emitting diode (LED). The pixel electrode 191 may be an anode as the hole injection electrode, and the common electrode 270 may be a cathode as the electron injection electrode. In contrast, the pixel electrode 191 may be the cathode, and the common electrode 270 may be the anode. Light is emitted when holes and electrons from the pixel electrode 191 and the common electrode 270 are injected into the light emission layer 370 and then excitons of which the injected holes and electrons are combined fall from an excited state to a ground state.

An encapsulation layer 390 may be located on the common electrode 270. The encapsulation layer 390 may include a plurality of inorganic layers, or a structure in which the inorganic layer and the organic layer are alternately stacked.

Figure 9:
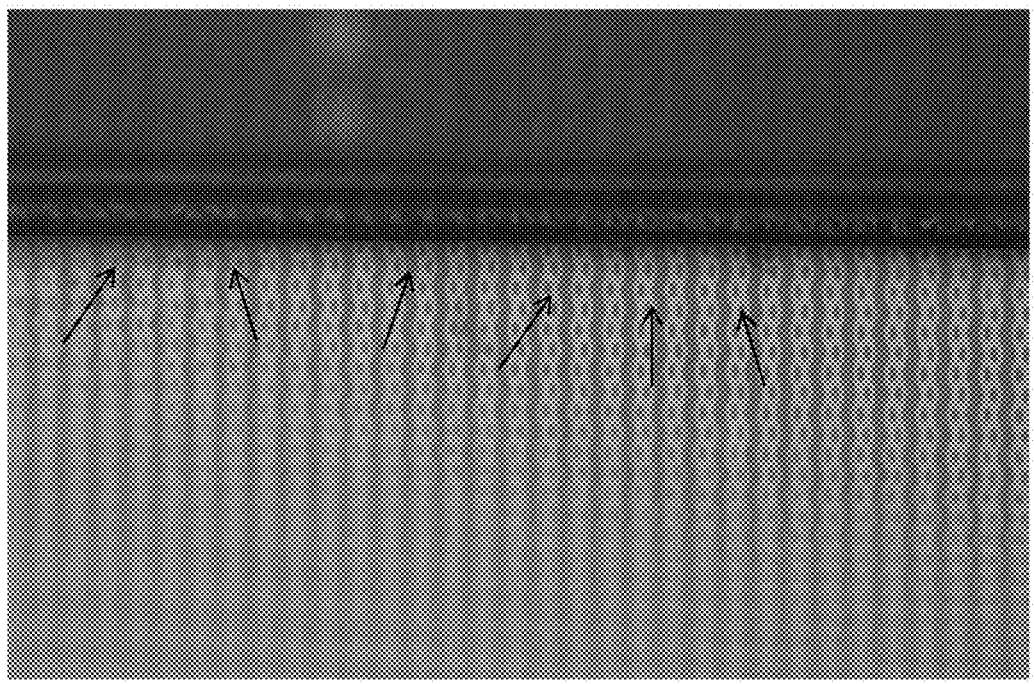
FIG. 9 and FIG. 10 are views showing an image of a bending area according to some example embodiments of the present invention.
Figure 10:
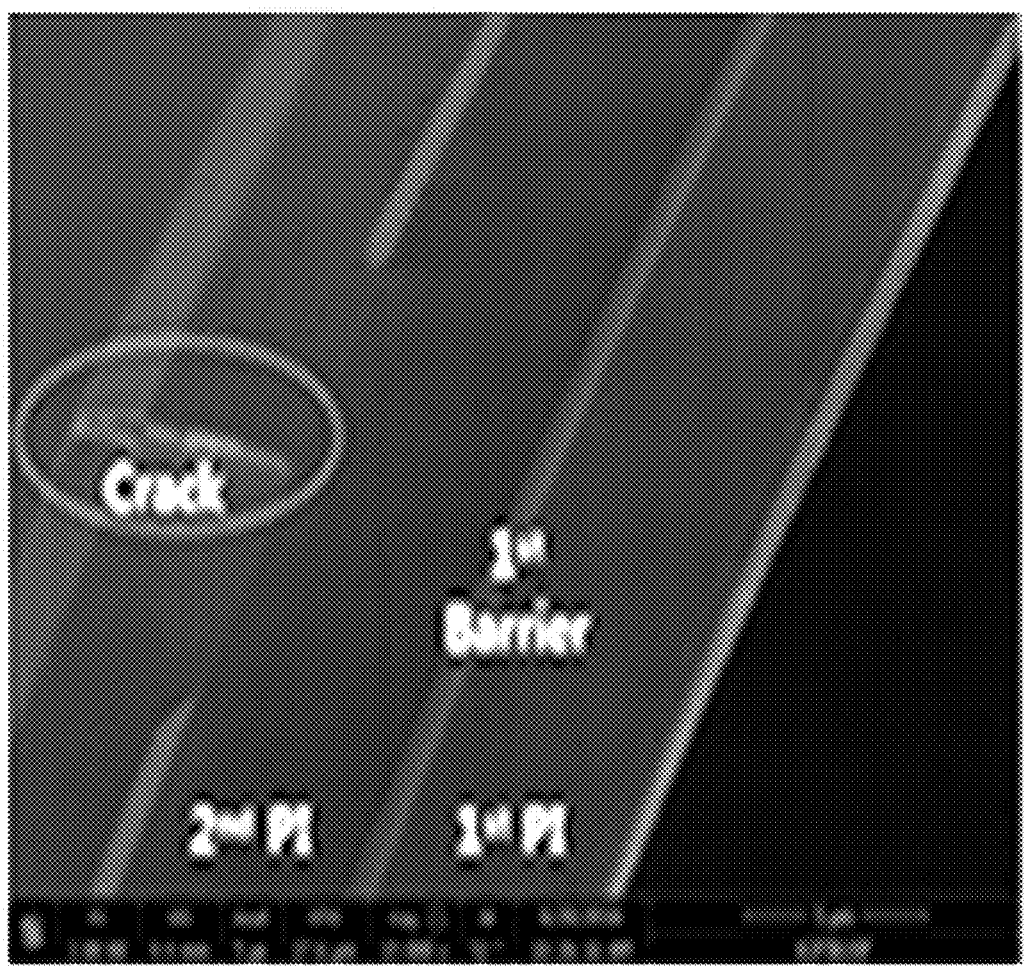

Next, the bending area of the display device according to some example embodiments is described with reference to FIG. 9 and FIG. 10. FIG. 9 and FIG. 10 are comparison images for the bending area, respectively.

Referring to FIG. 9, there is a part recognized with a transverse line like a part indicated by a red arrow, and this means that a crack is generated in the bending area. Referring to FIG. 10, it may be confirmed that the crack is generated in the bending area like a part indicated by a yellow circle.

However, according to some example embodiments of the present invention, the bending area includes the through-hole and the groove, and the through-hole and the groove may relieve the stress applied to the substrate, the insulating layer, and the signal line by the bending of the substrate. Accordingly, the crack, the detaching, or the like of the constituent elements generated by the bending may be prevented or reduced.

Also, as the protection layer according to some example embodiments includes the protrusion, the adherence of the substrate and the insulating layer may be reinforced.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SOME SYMBOLS

100: substrate
200: display unit
500: protection layer

What is claimed is:
1. A display device comprising:
a substrate including a first area, a second area, and a bending area between the first area and the second area;
a display unit overlapping the first area; and
a protection layer overlapping the bending area,
wherein the substrate includes a groove overlapping the bending area,
the protection layer is in the groove,
the substrate includes a first polymer layer, a first barrier layer, and a second polymer layer,
the second polymer layer includes the groove, and
a height of the groove of the second polymer layer is smaller than a height of the second polymer layer.
2. The display device of claim 1, wherein
the display device further includes an insulating layer overlapping the bending area, and
the insulating layer includes at least one among a first insulating layer, a second insulating layer, and a third insulating layer extending from the display unit.
3. The display device of claim 2, wherein
the insulating layer includes a through-hole, and
an edge of the through-hole and an edge of the groove are aligned.

4. The display device of claim 1, wherein
the protection layer overlaps a part of the first area and the second area.

5. The display device of claim 1, wherein
the display device further includes:
a driving unit at the second area; and
a signal line connecting the driving unit and the display unit and crossing the bending area.

6. The display device of claim 5, wherein
the groove has a dot shape in a plan view.

7. The display device of claim 5, wherein
the groove has a line shape in a plan view.

8. The display device of claim 5, wherein
the groove is separated from the signal line in a plan view.

9. A display device comprising:
a substrate including a first area, a second area, and a bending area between the first area and the second area;
a display unit overlapping the first area;
a protection layer overlapping the bending area; and
an insulating layer between the protection layer and the substrate,
wherein the protection layer includes a protrusion penetrating at least part of the insulating layer and the substrate,
the substrate includes a first polymer layer, a first barrier layer, and a second polymer layer,
the second polymer layer includes a groove, and
the protrusion is in the groove,
and a height of the groove of the second polymer is smaller than a height of the second polymer layer.

10. The display device of claim 9, wherein
the insulating layer includes a through-hole overlapping the groove, and
the protrusion is in the through-hole.

11. The display device of claim 9, wherein
the insulating layer includes at least one among a first insulating layer, a second insulating layer, and a third insulating layer extending from the display unit.

12. The display device of claim 9, wherein
the protection layer overlaps a part of the first area and the second area.

13. The display device of claim 9, wherein
the display device further includes:
a driving unit at the second area; and
a signal line connecting the driving unit and the display unit and crossing the bending area.

14. The display device of claim 13, wherein
the protrusion has a dot shape in a plan view.

15. The display device of claim 13, wherein
the protrusion has a line shape in a plan view.

16. The display device of claim 13, wherein
the protrusion is separated from the signal line in a plan view.

* * * * *